United States Patent
Chen et al.

(10) Patent No.: US 8,514,109 B2
(45) Date of Patent: Aug. 20, 2013

(54) METHOD AND DEVICE FOR ENCODING AN INPUT BIT SEQUENCE AND CORRESPONDING DECODING METHOD AND DEVICE

(75) Inventors: Qu Qing Chen, Beijing (CN); Kang Ying Cai, Beijing (CN); Zhi Bo Chen, Beijing (CN); Jun Teng, Beijing (CN)

(73) Assignee: Thomson Licensing, Boulogne-Billcourt (FR)

( * ) Notice: Subject to any disclaimer, the term of this patent is extended or adjusted under 35 U.S.C. 154(b) by 51 days.

(21) Appl. No.: 13/138,715

(22) PCT Filed: Mar. 30, 2010

(86) PCT No.: PCT/EP2010/054259
§ 371 (c)(1),
(2), (4) Date: Sep. 21, 2011

(87) PCT Pub. No.: WO2010/115790
PCT Pub. Date: Oct. 14, 2010

(65) Prior Publication Data
US 2012/0013491 A1    Jan. 19, 2012

(30) Foreign Application Priority Data
Apr. 9, 2009 (EP) .................................... 09305307

(51) Int. Cl.
*H03M 7/30* (2006.01)
(52) U.S. Cl.
USPC ........................................... 341/107; 341/51
(58) Field of Classification Search
USPC .................................................. 341/51, 107
See application file for complete search history.

(56) References Cited

U.S. PATENT DOCUMENTS

| | | | | |
|---|---|---|---|---|
| 5,357,250 | A * | 10/1994 | Healey et al. .................. | 341/107 |
| 5,418,863 | A * | 5/1995 | Ando ............................. | 382/232 |
| 6,262,737 | B1 * | 7/2001 | Li et al. ......................... | 345/419 |
| 2005/0201629 | A1 * | 9/2005 | Karczewicz et al. .......... | 382/240 |

OTHER PUBLICATIONS

Salomon et al., "Data Compression: The Complete Reference Section 2.14, 2.15: (Adaptive) Arithmetic Coding", Data Compression: The Complete Reference, New York, NY, Jan. 1, 1998, pp. 69-84.
Anonymous, "Non Return to Zero", Internet Article [Online], Mar. 22, 2009.
Jain et al., "An Outline of Communication Theory and Systems", Internet Article, [Online], 1999.
Search Report Dated July 1, 2010 ISR 210 for application PCT/EP2010/054259.

* cited by examiner

*Primary Examiner* — Howard Williams
(74) *Attorney, Agent, or Firm* — Robert D. Shedd; Paul P. Kiel; Xiaoan Lu

(57) ABSTRACT

The invention is made in the technical field of encoding and decoding of bit sequences. The invention proposes a device for compression-encoding an input bit sequence in which Zeroes and Ones occur equally frequent, comprising an XOR gate adapted for receiving pairs of immediately succeeding bits of the input bit sequence as inputs and for outputting further bits of another bit sequence, means for adding a bit to said other bit sequence wherein the added bit is a primary bit which is equal to a primary bit of the input bit sequence or a last bit which is equal to a last bit of the input bit sequence, and means for encoding the other sequence. The XOR gate transforms the input bit sequence into the other bit sequence which comprises more uneven frequencies of occurrence of Zeroes and Ones than the input bit sequence.

15 Claims, 1 Drawing Sheet

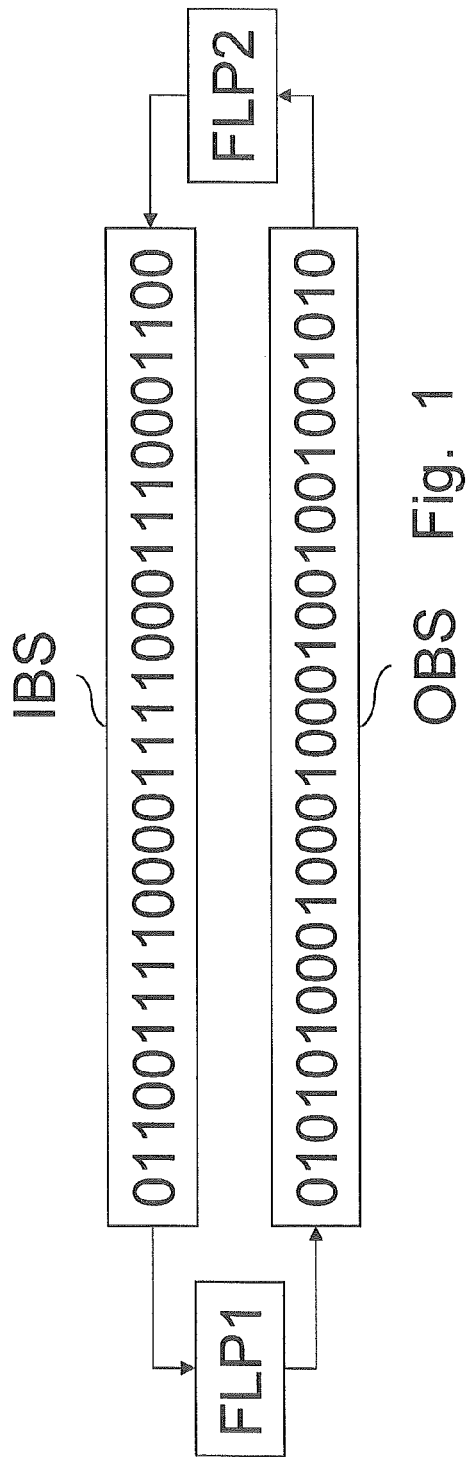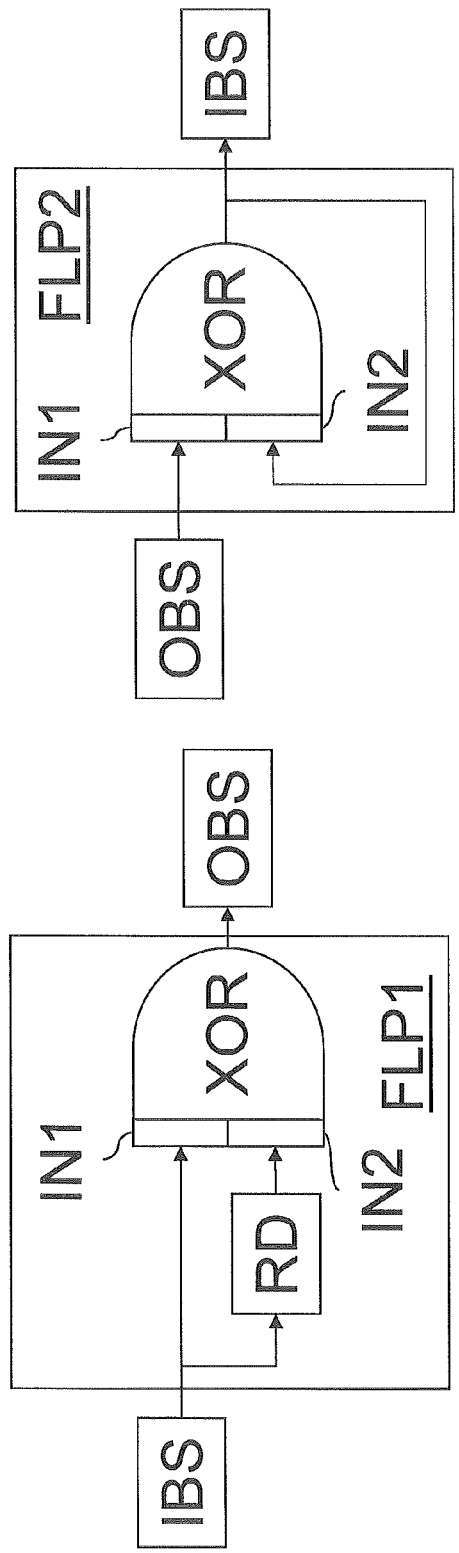

METHOD AND DEVICE FOR ENCODING AN INPUT BIT SEQUENCE AND CORRESPONDING DECODING METHOD AND DEVICE

This application claims the benefit, under 35 U.S.C. §365 of International Application PCT/EP2010/054259, filed Mar. 30, 2010, which was published in accordance with PCT Article 21(2) on Oct. 14, 2010 in English and which claims the benefit of European patent application No. 09305307.2, filed Apr. 9, 2009.

TECHNICAL FIELD

The invention is made in the technical field of encoding and decoding of bit sequences.

BACKGROUND

Bit sequences results, for instance, from encoding digital multimedia content like audio, video, combinations thereof or side information accompanying such content. Or such bit sequences may result from encoding signed integers representing geometry data which specify locations of vertices of three-dimensional mesh models. Encoding such bit sequences further, such that a compact representation of the encoded content and/or of the side information is achieved, is crucial for efficient use of storage capacities and transmission bandwidth.

Each bit sequence may also be understood as consisting of runs of Zeroes alternating with runs of Ones wherein each run is a contiguous sub-sequence of one or more equally valued bits which is immediately followed and immediately preceded by another run of bits each having a different bit value as long as the run is neither the very first nor the very last run of the bit sequence.

In bit sequences, bits of a first possible bit value and bits of a different second possible bit value commonly occur with significantly different frequencies, e.g. Zeroes are more likely than Ones or vice versa. Then, entropy of the bit sequence is smaller than the number of bits comprised in the bit sequence.

If so, there is redundancy in the bit sequence which can be removed by lossless compression.

It is known to use an entropy coding method for lossless compression of bit sequences. Basically, there are three kinds of entropy coding method: (1) variable length coding (VLC), like Huffman coding, (2) arithmetic coding, and (3) dictionary-based compression, like Lempel-Ziv compression or Lempel-Ziv-Welch compression.

The effect of entropy coding is that, difference between entropy of the compressed bit sequence and number of bits comprised in the compressed bit sequence is smaller than difference between entropy of and number of bits comprised in the bit sequence prior to compression.

There is ongoing effort in the art for improving encoding.

INVENTION

In order to achieve such improvement, the invention proposes a method for encoding an input bit sequence in which Zeroes and Ones occur equally frequent according to claim 1 and a corresponding device according to claim 7.

Said method for encoding an input bit sequence in which Zeroes and Ones occur equally frequent comprises sequential or at least partly parallel execution of the steps of generating an other bit sequence by flipping bits of the input bit sequence, wherein only those bits flipped which are immediately preceded in the input bit sequence by bits having a predetermined bit value, and compression-encoding the other bit sequence.

For a run which has a run length L longer than two bit and consists of bits of said predetermined bit value there are L−1 bits flipped to the other bit value while only one bit is flipped to said predetermined bit value. Thus, after flipping frequency of occurrence of said predetermined bit value is decreased and frequency of occurrence of said other bit-value is increased which can be exploited for bit rate saving in encoding step.

In an embodiment of said method for encoding an input bit sequence, the other bit sequences comprises a primary bit and further bits wherein the primary bit is equal to a primary bit of the input bit sequence and the further bits are determined using outputs of an XOR gate which receives pairs of immediately succeeding bits of the input bit sequence as inputs.

The invention further proposes a bitstream or storage medium comprising an encoded bit sequence, said encoded bit sequence being encoded according to the method of claim 1 or the method of one of the claims dependent on claim 1.

And, the invention proposes a method for decoding an output bit sequence according to claim 9 and a corresponding device according to claim 15.

Said method for decoding an output bit sequence comprises sequential or at least partly parallel execution of the steps of decoding an other bit sequence, and generating said output bit sequence by flipping bits of the other bit sequence, wherein the flipped bits are immediately preceded in the output bit sequence by bits having a predetermined bit value.

In an embodiment of said method for decoding an output bit sequence, the output bit sequences comprises a primary bit equal to a primary bit of the other bit sequence and further bits for the output bit sequence are determined using output bits of an XOR gate which receives pairs of bits as input, each pair of bits comprising one bit of the other bit sequence and one respective immediately preceding output bit of the output bit sequence.

There are further embodiments, in which the input bit sequence which is encoded and/or output bit sequence which is decoded may be a bit plane of a sequence of binary representations of signed integers representing geometry data which specify locations of vertices of at least one three-dimensional mesh model, said binary representations comprising sign bits.

Each of the further embodiments may comprise the feature that sign bits are comprised in binary representations of non-zero integers, only.

In yet further embodiments said binary representations comprise variable length codes of absolutes of said integers.

In even yet further embodiments context based binary arithmetic encoding respectively context based binary arithmetic decoding is used for encoding respectively decoding the other bit sequence.

DRAWINGS

Exemplary embodiments of the invention are illustrated in the drawings and are explained in more detail in the following description.

In the figures:

FIG. 1 depicts an example input bit sequence and an exemplary other bit sequence generated from the example input bit sequence, FIG. 2 depicts an exemplary first bit flipping module with an XOR-gate and a retarding module, and FIG. 3 depicts an exemplary second bit flipping module with a further XOR-gate.

EXEMPLARY EMBODIMENTS

In FIG. 1, an exemplary input bit sequence IBS of 30 bits length is depicted. Zeroes and Ones occur equally frequent in IBS, i.e. there are 15 Zeroes and 15 Ones in IBS. The entropy of the exemplary input bit sequence IBS can be calculated as $$H(B)=-15*\log_2(15/30)-15*\log_2(15/30)=30$$

So it appears as if 30 bits are required for representing IBS.

But, from the exemplary input bit sequence IBS an exemplary other sequence OBS can be formed which has a reduced entropy wherein the exemplary input bit sequence IBS can be reconstructed from the exemplary other sequence OBS of reduced entropy.

The exemplary other sequence OBS may be formed using an exemplary first bit flipping module FLP1, for instance. And the exemplary input bit sequence IBS may be reconstructed from the exemplary other sequence OBS, for instance, in using an exemplary second bit flipping module FLP2. Module FLP1 is depicted in detail in FIG. 2 and FLP2 is depicted in detail in FIG. 3.

The exemplary first flipping module FLP1 implements following method: (a) receiving a bit of said input bit sequence IBS and using it as current bit, (b) outputting a bit having a value equal to said primary bit of said input bit sequence, (c) receiving a next bit of said input bit sequence IBS, (d) outputting a bit having a value different from the next bit's value if the current bit is of a predetermined possible bit value, which is One in the example, and outputting a bit having the next bit's value, otherwise, (e) repeating steps (c) and (d) until the end of the bit sequence is reached wherein said next bit is used as current bit.

In OBS, there is a One for each Zero of IBS which immediately precedes a One. Further, for each One of IBS which immediately precedes a One there is Zero in OBS.

Since IBS comprises 10 Zeroes immediately following a One and only 5 Ones immediately following a One, Zeroes and Ones appear with different frequencies in IBS and in OBS.

That is, in OBS there are only 10 Zeroes but 20 Ones. Thus, entropy of OBS is:

$$H(OBS)=-10*\log_2(10/30)-20*\log_2(20/30)=27.5489$$

This reduction in entropy may be exploited in a further compression step which further encodes such that the required amount of bits better approximates the overall entropy of binary sequence OBS.

The exemplary first bit flipping module FLP1 is depicted FIG. 2 in more detail. Said first exemplary bit flipping module FLP1 architecture comprises an XOR-gate XOR which comprises a first and a second input IN1 and IN2. In each time step, the XOR-gate XOR receives two bits at its inputs IN1 and IN2 and outputs an output bit at its output. The outputted bit reflects whether the inputted bits have a same bit value or not. If bits inputted to the XOR-gate XOR are equal to each other, a bit of a first of two possible bit values is outputted, otherwise the outputted bit has the second of the two possible bit values. That is, the XOR-gate XOR implements an exclusive OR-operation.

The exemplary encoding architecture depicted FIG. 2 further comprises a retarding module RM. Said retarding device comprises a buffer in which a bit, which is input to the first input port IN1 of the XOR-gate XOR in certain time step, is buffered for one time step. Then, in a next time step, the buffered bit is input to the second input port IN2 of the XOR-gate XOR while an immediately succeeding bit, which is succeeding the buffered bit in the input bit sequence IBS, immediately, is inputted to the first input port IN1 of the XOR-gate XOR.

According a first configuration, the XOR-gate XOR may be configured such that if there is nothing inputted to the second input port IN2 than the output of the XOR-gate XOR equals the input at the first input port IN1 and if there is nothing inputted to the first input port IN1 than there is no output of the XOR-gate XOR independent from what is inputted at the second input port IN2.

This is an easy way to ensure that a primary bit of the other bit sequence OBS equals a primary bit of the input bit sequence IBS and that outputting of bits to the other bit sequence OBS is terminated after reaching the end of the input bit sequence IBS.

According a second configuration, the XOR-gate XOR may be configured such that if there is nothing inputted to the second input port IN2 than there is no output of the XOR-gate XOR independent from what is inputted at the first input port IN1 and if there is nothing inputted to the first input port IN1 than there the output of the XOR-gate XOR equals the input at the second input port IN2.

This is another easy way for achieving the benefits of the invention. Then, the exemplary first flipping module FLP1 comprising the alternatively configured XOR gate XOR implements following method: (a) receiving a bit of said input bit sequence IBS and using it as current bit, (b) receiving a next bit of said input bit sequence IBS, (c) outputting a bit having a value different from the next bit's value if the current bit is of a predetermined possible bit value, which is One in the example, and outputting a bit having the next bit's value, otherwise, (d) repeating steps (b) and (c) until a last bit of the bit sequence is received wherein said next bit is used as current bit and (e) outputting the last received bit.

The exemplary second bit flipping module FLP2 is depicted FIG. 3 in more detail. Said second exemplary bit flipping module FLP2 architecture comprises a further XOR-gate XOR which is equivalent to the XOR-gate XOR of the first bit flipping module FLP1. That, is an XOR-operation on inputs of the further XOR-gate XOR is implemented.

In correspondence to the first configuration of the XOR gate XOR in the first bit flipping module FLP1, the further XOR-gate XOR may be configured such that if there is nothing inputted to the second input port IN2 than the output of the XOR-gate XOR equals the input at the first input port IN1 and if there is nothing inputted to the first input port IN1 than there is no output of the XOR-gate XOR independent from what is inputted at the second input port IN2.

In correspondence to the second configuration of the XOR gate XOR in the first bit flipping module FLP1, the XOR-gate XOR may be configured such that if there is nothing inputted to the second input port IN2 than a predefined bit value is outputted by the XOR-gate XOR independent from what is inputted at the first input port IN1 and if there is nothing inputted to the first input port IN1 than the output of the XOR-gate XOR equals the input at the second input port IN2.

Second configuration of the XOR gate XOR results in that the very last bit of the other bit sequence OBS comprises information about whether the input bit sequence IBS starts with the first or with the second of the two possible bit values.

The second flipping module FLP2 differs from the first flipping module FLP1 in that the second input port IN2 of the further XOR-gate XOR is provided with the output of the further XOR-gate XOR.

The input bit sequence may represent a bit plane of binary representations of signed integers, which, for instance, may represent (x,y,z)-coordinates of vertices of a three-dimensional mesh model, said binary representations comprising sign bits and variable length codes of absolutes of the integers.

That is, a first bit of each binary representation indicates whether the signed integer represented by said binary representation is equal to Zero. E.g. the first bit is One if the respective integer is Zero, and the first bit is Zero, otherwise. If so, the respective binary representation comprises only this Zero-indicating bit.

For each non-Zero signed integer, the corresponding binary representation further comprise at least a second bit and a third bit wherein the second bit indicates the sign of the non-Zero integer. E.g. the second bit is One if the respective signed integer is non-negative, and the second bit is Zero, otherwise.

The third bit-together with one or more further bits comprised in remainder of said corresponding binary representation-represents a variable length code of absolutes the respective non-Zero signed integer. The variable length code may be a Golomb-Code, for instance, Golomb-Rice-Code, Exp-Golomb-Code or Hybrid-Golomb-Code, or any other bijective variable length code.

Since said absolutes are equal to or larger than 1, Hybrid-Golomb-Codes of the absolutes, each reduced by 1, can be formed, for instance.

A first bit plane may comprise all first bits of all binary representations representing vertex-coordinates of a same model and a second bit plane may comprise all second bits of all binary representations representing vertex-coordinates of the same model.

That is, the first bit plane comprises one bit for each Zero or non-Zero signed integer comprised in vertex coordinates of the mesh model. The second bit plane comprises one bit for each non-Zero signed integer comprised in vertex coordinates of the mesh model.

That is, in the second bit plane second bits of binary representations which are separated in the sequence of signed integers by Zeroes, only, may be immediately subsequent to each other.

A third bit plane respectively further bit planes can be formed from the third bits or the further bits, respectively.

Table 1 exemplarily depicts a sequence of example signed integers and codes:

TABLE 1

Binary representations comprising Zero bits, Sign bits and Hybrid Golomb code of absolute values

| Index | Absolute values | zero flag | Sign flag | Hybrid Golomb Code Of (Abs-1) |
|---|---|---|---|---|
| 0 | 1 | 0 | 1 | 1 |
| 1 | 1 | 0 | 1 | 1 |
| 2 | 2 | 0 | 1 | 01 |
| 3 | 0 | 1 | | |
| 4 | 0 | 1 | | |
| 5 | 0 | 1 | | |
| 6 | 0 | 1 | | |
| 7 | 0 | 1 | | |
| 8 | 0 | 1 | | |
| 9 | 0 | 1 | | |
| 10 | -4 | 0 | 0 | 0011 |
| 11 | -4 | 0 | 0 | 0011 |
| 12 | -4 | 0 | 0 | 0011 |
| 13 | -3 | 0 | 0 | 0010 |
| 14 | 1 | 0 | 1 | 1 |
| 15 | 0 | 1 | | |
| 16 | 0 | 1 | | |
| 17 | 0 | 1 | | |
| 18 | 0 | 1 | | |
| 19 | 12 | 0 | 1 | 00001011 |
| 20 | 11 | 0 | 1 | 00001010 |
| 21 | 9 | 0 | 1 | 00001000 |
| 22 | -10 | 0 | 0 | 00001001 |
| 23 | -10 | 0 | 0 | 00001001 |
| 24 | -9 | 0 | 0 | 00001000 |
| 25 | -13 | 0 | 0 | 00001100 |
| 26 | -16 | 0 | 0 | 00001111 |
| 27 | 0 | 1 | | |
| 28 | 0 | 1 | | |
| 29 | 0 | 1 | | |
| 30 | 0 | 1 | | |
| 31 | -1 | 0 | 0 | 1 |
| 32 | -1 | 0 | 0 | 1 |
| 33 | -1 | 0 | 0 | 1 |
| 34 | -59 | 0 | 0 | 000000111010 |
| 35 | -63 | 0 | 0 | 000000111110 |
| 36 | -63 | 0 | 0 | 000000111110 |
| 37 | -63 | 0 | 0 | 000000111110 |
| 38 | -63 | 0 | 0 | 000000111110 |
| 39 | 1 | 0 | 1 | 1 |
| 40 | 1 | 0 | 1 | 1 |
| 41 | 1 | 0 | 1 | 1 |
| 42 | 0 | 1 | | |
| 43 | 0 | 1 | | |
| 44 | 0 | 1 | | |
| 45 | 0 | 1 | | |

Application of the inventive principle to this example signed integer sequence results in Table 2:

TABLE 2

Other binary representations

| Index | Absolute values | XOR zero flag | XOR Sign flag | XOR Of Hybrid Golomb |
|---|---|---|---|---|
| 0 | 1 | 0 | 1 | 1 |
| 1 | 1 | 0 | 0 | 0 |
| 2 | 2 | 0 | 0 | 11 |
| 3 | 0 | 1 | | |
| 4 | 0 | 0 | | |
| 5 | 0 | 0 | | |
| 6 | 0 | 0 | | |
| 7 | 0 | 0 | | |
| 8 | 0 | 0 | | |
| 9 | 0 | 0 | | |
| 10 | -4 | 1 | 1 | 0111 |
| 11 | -4 | 0 | 0 | 0000 |
| 12 | -4 | 0 | 0 | 0000 |
| 13 | -3 | 0 | 0 | 0001 |
| 14 | 1 | 0 | 1 | 1 |
| 15 | 0 | 1 | | |
| 16 | 0 | 0 | | |
| 17 | 0 | 0 | | |
| 18 | 0 | 0 | | |
| 19 | 12 | 1 | 0 | 10101011 |
| 20 | 11 | 0 | 0 | 00000001 |
| 21 | 9 | 0 | 0 | 00000010 |
| 22 | -10 | 0 | 1 | 00000001 |
| 23 | -10 | 0 | 0 | 00000000 |
| 24 | -9 | 0 | 0 | 00000001 |

TABLE 2-continued

Other binary representations

| Index | Absolute values | XOR zero flag | XOR Sign flag | XOR Of Hybrid Golomb |
|---|---|---|---|---|
| 25 | −13 | 0 | 0 | 00000100 |
| 26 | −16 | 0 | 0 | 00000011 |
| 27 | 0 | 1 | | |
| 28 | 0 | 0 | | |
| 29 | 0 | 0 | | |
| 30 | 0 | 0 | | |
| 31 | −1 | 1 | 0 | 1 |
| 32 | −1 | 0 | 0 | 0 |
| 33 | −1 | 0 | 0 | 0 |
| 34 | −59 | 0 | 0 | 100010100110 |
| 35 | −63 | 0 | 0 | 000000000100 |
| 36 | −63 | 0 | 0 | 000000000000 |
| 37 | −63 | 0 | 0 | 000000000000 |
| 38 | −63 | 0 | 0 | 000000000000 |
| 39 | 1 | 0 | 1 | 1 |
| 40 | 1 | 0 | 0 | 0 |
| 41 | 1 | 0 | 0 | 0 |
| 42 | 0 | 1 | | |
| 43 | 0 | 0 | | |
| 44 | 0 | 0 | | |
| 45 | 0 | 0 | | |

The amount of bits comprised in the second bit plane equals the amount of non-Zero coordinates in the mesh model.

Obviously, for table 2 the ratio of the amount of ones divided by the amount of Zeroes is much smaller than for table 1. Thus, the other binary representation as exemplarily depicted in table 2 is better compressible in a subsequent encoding step.

A first, a second, a third, a fourth and a fifth bit plane of the exemplary signed integer sequence is exemplarily shown in table 3. There are further bit planes for the exemplary signed integer sequence but said further bit planes are not shown in table 3 for simplicity reasons:

TABLE 3

Bit plane examples

| First bit-plane | Second bit-plane | Third bit-plane | Fourth bit-plane | Fifth bit-plane |
|---|---|---|---|---|
| 0 | 1 | 1 | 1 | 1 |
| 0 | 0 | 0 | 1 | 0 |
| 0 | 0 | 1 | 0 | 0 |
| 1 | 1 | 0 | 0 | 0 |
| 0 | 0 | 0 | 0 | 1 |
| 0 | 0 | 0 | 0 | 0 |
| 0 | 0 | 0 | 0 | 0 |
| 0 | 1 | 1 | 0 | 0 |
| 0 | 0 | 1 | 0 | 0 |
| 0 | 0 | 0 | 0 | 0 |
| 1 | 0 | 0 | 0 | 0 |
| 0 | 1 | 0 | 0 | 0 |
| 0 | 0 | 0 | 0 | 0 |
| 0 | 0 | 0 | 0 | 0 |
| 1 | 0 | 0 | 0 | 0 |
| 0 | 0 | 1 | 0 | 0 |
| 0 | 0 | 0 | 0 | |
| 0 | 0 | 0 | | |
| 0 | 0 | 0 | | |
| 1 | 0 | 1 | | |
| 0 | 0 | 0 | | |
| 0 | 0 | 0 | | |
| 0 | 0 | 0 | | |
| 0 | 1 | 1 | | |
| 0 | 0 | 0 | | |
| 0 | 0 | 0 | | |
| 1 | | | | |
| 0 | | | | |
| 0 | | | | |
| 0 | | | | |
| 1 | | | | |
| 0 | | | | |
| 0 | | | | |
| 0 | | | | |
| 0 | | | | |
| 0 | | | | |
| 0 | | | | |
| 0 | | | | |
| 0 | | | | |
| 1 | | | | |
| 0 | | | | |
| 0 | | | | |
| 0 | | | | |

Syntax of proposed coding method exemplarily applied to geometry data looks like if a variable length code is used:

```
geometry data ( ){
    For (i=0;i<3;i++){
        XAE(0,zero_flag);
        IF (!zero_flag){
            XAE(1,sign_flag);
            XAE(2,Code[i][0]);
            code_len=1;
            while (!Code[i][code_len]){
                XAE(code_len+2,Code[i][code_len]);
                code_len++;
            }
            For (k=code_len;k<2*code_len;k++){
                XAE(k+2,Code[i][k]);
            }
        }
    }
}
``` with the following syntax semantics:

The geometry data of one vertex contains three components: x, y, and z. They are encoded separately.

zero_flag: A single bit to indicate whether the current integer number is zero.

sign_flag: A single bit to indicate whether the current non-zero integer number is positive or negative. For example, if sign_flag==1, then it is positive; otherwise, it is negative.

Code[i][k]: The k-th bit of the binary code of the i-th absolute value minus 1 wherein i=1, 2, 3, represents x, y, z component, respectively. The binary code is such that a leading sequence of Zeroes can be investigated in order to determine the length of the code. This is done in the while-loop.

XAE(c,v): First an XOR operation is conducted to compare the current bit value v with the previous bit under the same context model c, and then the output bit value of the XOR operation is encoded in context model c using context based adaptive binary arithmetic coding. The XOR operation is such that if current bit value v is the first bit within the context model, then the bit itself is encoded. Otherwise, if the current bit value v is the same as an immediately previous bit value of the same context model c, then "0" is encoded; otherwise "1" is encoded.

Hybrid-Golomb code is a combination of Golomb-Rise Code and Exp-Golomb Code. In the Golomb-Rice code, the number of codes with the same code-length does not change when the code-length grows up. In the Exp-Golomb Code, the number of codes with the same code-length increases exponentially when the code-length grows up. Unary code is a special Golomb-Rice code.

It should be understood that the exemplary embodiments described above are for illustrative purposes only and that they shall not be interpreted as in any way limiting the spirit and scope of the invention for which protection is sought, said scope being solely defined by the claims.

In particular, the invention is not at all limited to spatial data but applicable to all kind of data comprising file data or measurement data, for instance.

The invention claimed is:

1. A method for encoding an input bit sequence, comprising:
    generating another bit sequence by flipping only bits of the input bit sequence which are immediately preceded in the input bit sequence by a respective bit having a predetermined bit value; and
    encoding the another bit sequence using arithmetic encoding.

2. Method according to claim 1, wherein the another bit sequence comprises a primary bit equal to a primary bit of the input bit sequence and further bits for the another bit sequence are determined using outputs of an XOR gate which receives pairs of immediately succeeding bits of the input bit sequence as inputs.

3. Method according to claim 1, wherein the input bit sequence is a bit plane of a sequence of binary representations of signed integers representing geometry data which specify locations of vertices of at least one three-dimensional mesh model, said binary representations comprising sign bits.

4. Method according to claim 3, wherein sign bits are comprised in binary representations of non-zero integers, only.

5. Method according to claim 3, wherein said binary representations comprise variable length codes of absolutes of said integers.

6. Method according to claim 1, wherein context based binary arithmetic coding is used for encoding the another bit sequence.

7. Non-transitory storage medium comprising an encoded bit sequence, said encoded bit sequence being encoded according to the method of claim 1.

8. Device for encoding an input bit sequence, comprising:
    means adapted for implementing an XOR gate comprising two inputs adapted for receiving pairs of immediately succeeding bits of the input bit sequence as inputs and an output for outputting bits of another bit sequence;
    means for adding a bit to said another bit sequence wherein the added bit is a primary bit which is equal to a primary bit of the input bit sequence or a last bit which is equal to a last bit of the input bit sequence; and
    means for encoding the another bit sequence using arithmetic encoding.

9. Method for decoding an output bit sequence, comprising:
    decoding another bit sequence using arithmetic decoding; and
    generating said output bit sequence by flipping bits of the another bit sequence, wherein the flipped bits are immediately preceded in the output bit sequence by a respective bit having a predetermined bit value.

10. Method according to claim 9, wherein the output bit sequences comprises a primary bit equal to a primary bit of the another bit sequence and further bits for the output bit sequence are determined using output bits of an XOR gate which receives pairs of bits as input, each pair of bits comprising one bit of the another bit sequence and one respective immediately preceding output bit of the output bit sequence.

11. Method according to claim 9, wherein the output bit sequence is a bit plane of a sequence of binary representations of signed integers representing geometry data which specify locations of vertices of at least one three-dimensional mesh model, said binary representations comprising sign bits.

12. Method according to claim 11, wherein sign bits are comprised in binary representations of non-zero integers, only.

13. Method according to claim 11, wherein said binary representations comprise variable length codes of absolutes of said integers.

14. Method according to claim 9, wherein context based binary arithmetic decoding is used for decoding the other bit sequence.

15. Device for decoding an output bit sequence, said device comprises:
    means for de-compress decoding another bit sequence using arithmetic decoding,
    means adapted for implementing an XOR gate comprising a first input adapted for receiving bits of the other bit sequence and a second input connected to an output of the XOR gate, said output being for outputting bits of said output bit sequence, and
    means for adding a further bit to the output bit sequence wherein the further bit is a primary bit which is equal to a primary bit of the other bit sequence or a last bit which is equal to a last bit of the other bit sequence.

* * * * *